(12) United States Patent
Read

(10) Patent No.: US 7,596,673 B2
(45) Date of Patent: Sep. 29, 2009

(54) FAILURE TOLERANT DATA STORAGE

(75) Inventor: Christopher Jensen Read, San Diego, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 737 days.

(21) Appl. No.: 11/297,271

(22) Filed: Dec. 8, 2005

(65) Prior Publication Data

US 2007/0136525 A1 Jun. 14, 2007

(51) Int. Cl.
*G06F 12/16* (2006.01)

(52) U.S. Cl. .................. 711/170; 711/114; 711/161

(58) Field of Classification Search .................. None
See application file for complete search history.

(56) References Cited

U.S. PATENT DOCUMENTS

| | | | |
|---|---|---|---|
| 5,651,133 A * | 7/1997 | Burkes et al. ............... | 711/114 |
| 5,666,512 A * | 9/1997 | Nelson et al. ............... | 711/114 |
| 6,311,251 B1 * | 10/2001 | Merritt et al. ............... | 711/114 |
| 2002/0190878 A1 | 12/2002 | Luby | |
| 2003/0058958 A1 | 3/2003 | Shokrollahi et al. | |
| 2003/0226089 A1 | 12/2003 | Rasmussen et al. | |
| 2004/0021588 A1 | 2/2004 | Luby | |
| 2004/0075592 A1 | 4/2004 | Shokrollahi et al. | |
| 2004/0075593 A1 | 4/2004 | Shokrollahi et al. | |
| 2004/0101274 A1 | 5/2004 | Foisy et al. | |
| 2005/0010847 A1 | 1/2005 | Shokrollahi et al. | |
| 2005/0102598 A1 | 5/2005 | Shokrollahi | |
| 2005/0206537 A1 | 9/2005 | Shokrollahi et al. | |
| 2005/0219070 A1 | 10/2005 | Shokrollahi | |
| 2005/0226272 A1 | 10/2005 | Luby et al. | |

OTHER PUBLICATIONS

Fountain Codes, MacKay, Cavendish Laboratory, University of Cambridge, Proc. Of the Fourthe Workshop on Discrete Event Systems, Cagliari, Italy, 1998.

(Continued)

*Primary Examiner*—Denise Tran
(74) *Attorney, Agent, or Firm*—Miller Patent Services; Jerry A. Miller

(57) ABSTRACT

A method for storing data across N storage devices $S_1 \ldots S_N$, wherein at least one the storage devices has a storage capacity not equal to a storage capacity of others involves identifying a storage device $S_{MAX}$ having a largest capacity; encoding the data with an erasure encoder to produce F erasure codewords, where F=

$$\sum_{K=1}^{N} F_K$$

and distributing the erasure codewords among storage devices $S_1 \ldots S_N$ in approximate proportion to the storage capacity $C_K$ of each of $S_1 \ldots S_N$ so that enough erasure codewords are stored in each of the N storage devices to assure that if any one of the storage devices become unavailable, all of the data stored in the systems can be restored using the fountain codewords stored in the remaining storage devices. The erasure codewords can be fountain codewords.

12 Claims, 10 Drawing Sheets

OTHER PUBLICATIONS

Breakthrough Reliable Transport Technology for Data and Live Streaming Delivery over Imperfect Networks, Digital Fountain, Inc., 2002.

Digital Fountain Overview, Digital Fountain, Inc., 2002.

Raptor Codes, Shokrollahi, Digital Fountain, Inc. And Laboratoire d'algorithmique, Jun. 19, 2003.

Software-based Erasure Codes for Scalable Distributed Storage, Cooley, et al., undated—downloaded file bears creation date of 2003—publication date unknown.

Universal variable-length data compression of binary sources using fountain codes, Caire, et al., Princeton University, undated, downloaded file bears creation date of 2004—publication date unknown.

DF Raptor, Digital Fountain, Inc., 2004.

A Decentralized Algorithm for Erasure-Coded Virtual Disks, Frolund et al., HP Labs, undated, downloaded file bears creation date of 2004—publication date unknown.

Erasure Code Replication Revisited, Lin, et al., The Chinese University of Hong Kong, Undated, downloaded file bears creation date of 2004—publication date unknown.

DF Raptor Overcomes the Bandwidth Inefficiencies of TCP/IP, Digital Fountain, Inc., 2005.

How Unlimi-Tech Uses Digital Fountain's Advanced Coding Technology To Achieve Faster Data Transfer Speeds, Unlimi-Tech Software White Paper, Apr. 2005.

"Efficient and Reliable Data Distribution To Multiple Users," Digital Fountain, Inc., 2005.

* cited by examiner

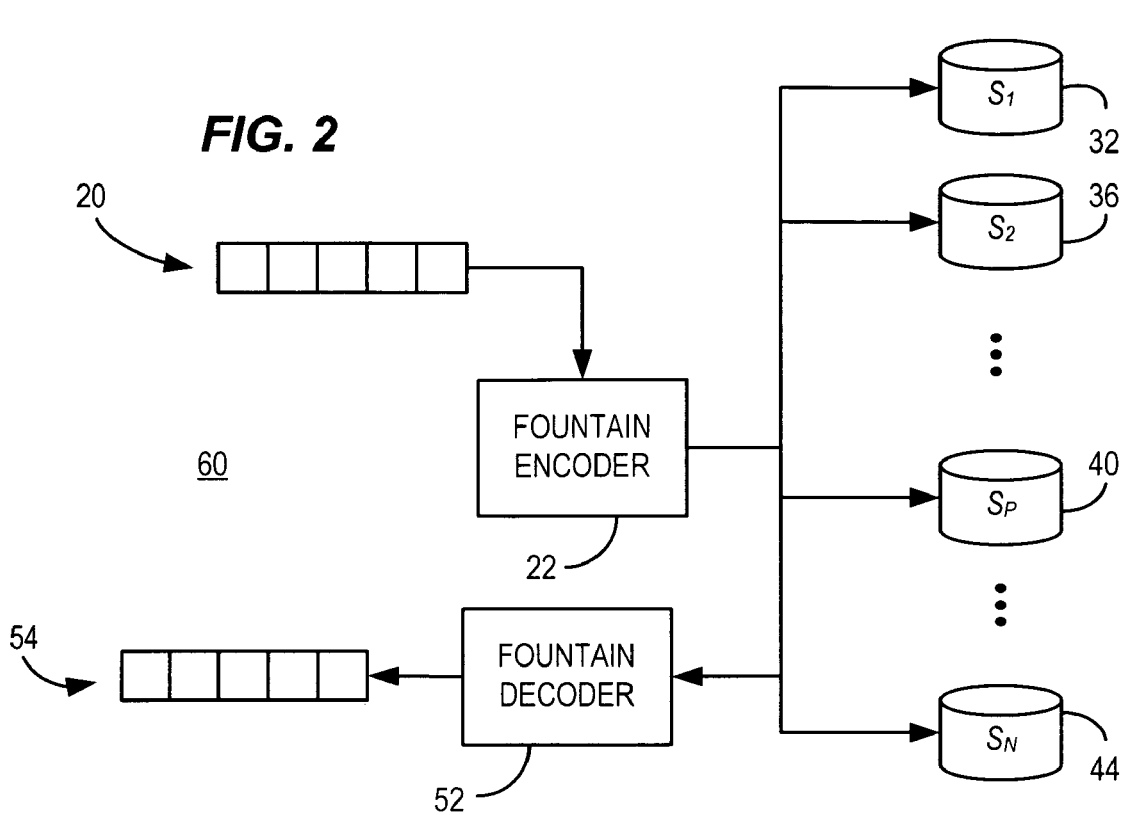
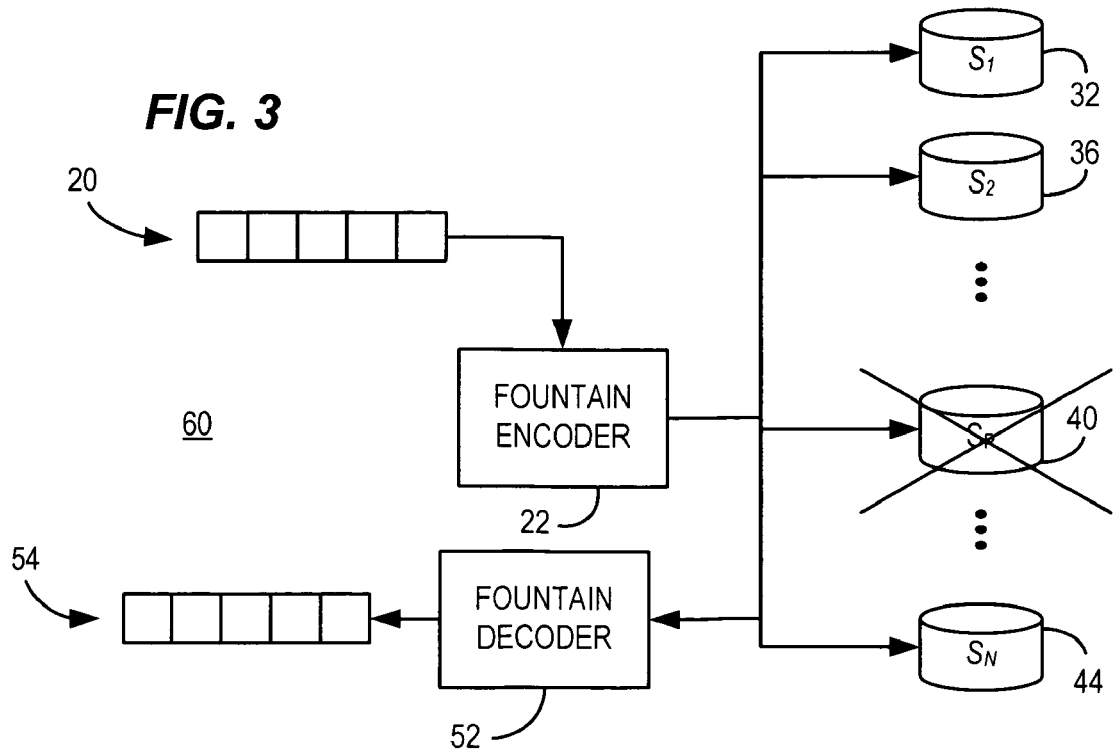

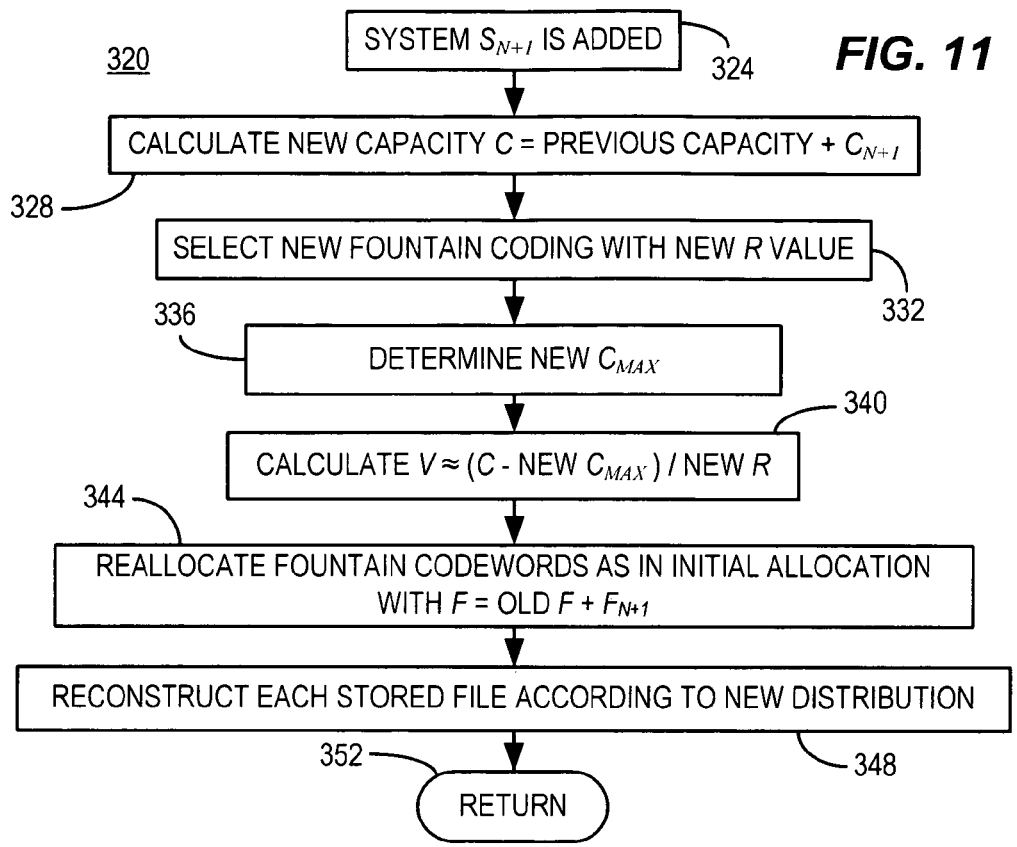

FAILURE TOLERANT DATA STORAGE

COPYRIGHT NOTICE

A portion of the disclosure of this patent document contains material which is subject to copyright protection. The copyright owner has no objection to the facsimile reproduction of the patent document or the patent disclosure, as it appears in the Patent and Trademark Office patent file or records, but otherwise reserves all copyright rights whatsoever.

BACKGROUND

RAID (Redundant Array of Inexpensive Disks or Redundant Array of Independent Disks) systems are in common use for securely and redundantly storing large amounts of data. The term RAID represents a family of techniques for managing collections of disks in such a way that desirable cost, availability, and performance properties are provided to host computing environments. RAID arrays come in various operating levels which are designated as RAID level 0 (RAID-0), RAID level 6 (RAID-6), etc. Additionally, there are multiple combinations of the various RAID levels that form hybrid RAID levels. Each RAID level represents a different form of data management and data storage within the RAID disk drive array. In conventional RAID systems and the like, the capacity of each disk in a given system generally has identical, or virtually identical storage capacity $C_J$ such that $C=C_1=C_2=\ldots=C_N$ for each of N storage systems. This makes distribution of storage among the various storage devices simple. While storage devices with capacity greater than C may be used in such a system, capacity over and above C is not used, resulting in an equivalent capacity that is limited to C. These disks are also normally very tightly coupled to a controller, and typically are contained within a single enclosure.

In home entertainment and other home network applications, as well as many business applications, storage devices tend to be added incrementally as storage needs grow. For example, a network including a television set top box, one or more home computers and a Personal Video recorder is generally established based on existing needs at the time of acquisition of each component, and often without regard for the data security provided in more advanced and secure storage systems such as RAID systems. In addition these systems are loosely coupled, over a network. In such systems, it is generally the case that $C_1 \neq C_2 \neq \ldots \neq C_N$ and it is not self evident from the operation of conventional RAID systems how one might distribute storage in order to assure secure storage in the face of an evolving network in a manner that assures no data loss if one component should fail. In fact, it is not evident how to proceed if any one of $C_J \neq C_K$ in such a system. As a consequence, RAID technology and similar technologies are not widely used in such environments. Thus, conventional backup techniques (which are often not rigorously deployed and enforced) are generally used to protect data, if anything is done at all. This often results in large amounts of data going unprotected against accidental erasure or destruction or hardware or software failure.

BRIEF DESCRIPTION OF THE DRAWINGS

Certain illustrative embodiments illustrating organization and method of operation, together with objects and advantages may be best understood by reference detailed description that follows taken in conjunction with the accompanying drawings in which:

FIG. 2 is a simplified block diagram of storage system 60 consistent with certain embodiments of the present invention.

FIG. 3 is a simplified block diagram of storage system 60 illustrating loss of storage device $S_P$, consistent with certain embodiments of the present invention.

FIG. 8 is a flow chart of an exemplary process 156 for distribution or redistribution of erasure encoded data, consistent with certain embodiments of the present invention.

FIG. 11 is a flow chart of an exemplary process 320 for management of addition of a storage device or system, consistent with certain embodiments of the present invention.

FIG. 12 is a flow chart of another exemplary process 360 for management of addition of a storage device or system, consistent with certain embodiments of the present invention.

DETAILED DESCRIPTION

Figure 1:
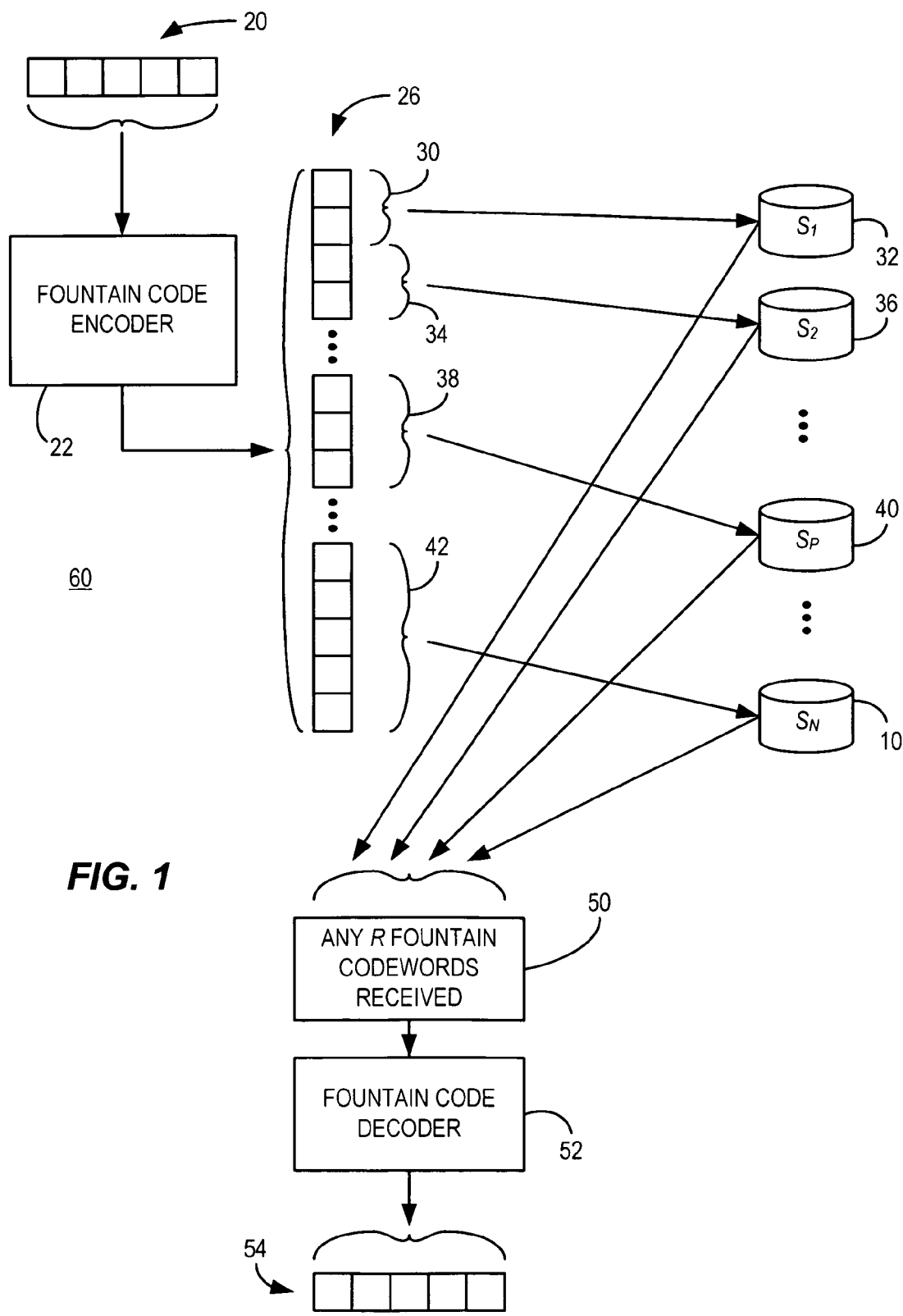
FIG. 1 is a block diagram of an exemplary storage system 60 using an exemplary erasure encoding system (fountain coding) consistent with certain embodiments of the present invention.

While this invention is susceptible of embodiment in many different forms, there is shown in the drawings and will herein be described in detail specific embodiments, with the understanding that the present disclosure of such embodiments is to be considered as an example of the principles and not intended to limit the invention to the specific embodiments shown and described. In the description below, like reference numerals are used to describe the same, similar or corresponding parts in the several views of the drawings.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically. The term "program" or "computer program" or similar terms, as used herein, is defined as a sequence of instructions designed for execution on a computer system. A "program", or "computer program", may include a subroutine, a function, a procedure, an object method, an object implementation, in an executable application, an applet, a servlet, a source code, an object code, a shared library/dynamic load library and/or other sequence of instructions designed for execution on a computer system.

Reference throughout this document to "one embodiment", "certain embodiments", "an embodiment" or similar terms means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an "inclusive or" meaning any one or any combination. Therefore, "A, B or C" means "any of the following: A; B; A and B; A and C; B and C; A, B and C". An exception to this definition will occur only when a combination of elements, functions, steps or acts are in some way inherently mutually exclusive.

The terms "storage device", "storage element" and "storage system" are used somewhat interchangeably herein. For example, a storage system, per se, may be treated as a storage element or storage device, but may be made up of multiple storage devices or storage elements (i.e., multiple disc drives may be used to create a single logical virtual drive). The particular meaning in a given statement should be interpreted to broadly incorporate each term where technically viable.

The term "fountain code" and related terms are used in a manner consistent with the technical literature to describe a class of sparse graph erasure codes such as Digital Fountain, Inc.'s Raptor codes (Digital Fountain, Inc., Fremont, Calif.) and LT codes (as described by Michael Luby in "LT Codes") in which D blocks of data are represented by any F "fountain codewords" (containing metacontent), where the number of bits of data represented by F is slightly more than the number of bits in D such that if any R of the blocks are recovered the original data can be recovered. Any number of fountain codewords can be generated using fountain coding to compensate for the projected loss of a channel or system. Details of the actual encoding and decoding process for fountain encoding is well documented in the literature and need not be repeated here.

The name "fountain code" comes from the metaphor of a fountain spraying droplets of water, wherein it makes no difference which droplets fill the glass, it only matters that enough droplets are collected to fill it. A fountain code defines a group of mathematical of equations to encode the data and decode the data. The encoded fountain codewords contain the original data, but there can be as many fountain codewords as needed to overcome lost fountain codewords and still be able to recover the original blocks of data. These fountain codewords (or simply codewords or codes) are constructed such that the decoder can recover the original data from any combination of the fountain codewords, so long as a minimum number of fountain codewords are recovered. Fountain encoders have the ability to generate a huge number (generally $\gg R$) of fountain codewords from any original set of source data. The original data can be recovered from an amount of data that is only slightly larger than the original data, and the encoding and decoding can be carried out rapidly.

Another metaphor often used to explain fountain codes is that of a system of linear equations. For example, with N simultaneous independent equations and N-J unknowns, any N-J of the equations can be used to solve for the N-J unknowns. Using fountain codes, a formula for the data can be stored across multiple storage devices in a manner such that as long as a minimum number of fountain codewords are recovered, the formula can be constructed to reconstruct the data. Fountain encoding is used as an example in the description that follows, but the present invention should not be considered limited to fountain coding since other types of erasure encoding can be utilized in a manner consistent with certain embodiments.

For purposes of this document, the following symbols are used to simplify the expression of mathematical or other ideas in connection with exemplary fountain encoding, but should be interpreted to encompass equivalent parameters in other erasure encoding:

J, K, P=a positive integer used as a counter or designator of a particular numbered element.

N=a maximum integer count or element number of counter or numbered element J, K, P.

M=a maximum integer count for a number of capacity bands.

$S_K$=storage element or system number K.

$C_J$=capacity of a system disc drive or other storage element number J. $C_J$ is the capacity of $S_J$.

$S_{MAX}$=storage element with maximum storage capacity.

C=total storage capacity of a system of disc drives or other storage elements.

In a system of N elements $C_1$ through $C_N$, $C=C_1+C_2+\ldots+C_N$.

$F_J$=number of fountain codewords allocated for a given storage element $C_J$.

$C_{MAX}$=storage capacity of the largest capacity storage device in a system of storage devices.

F=a total number of fountain codewords within a system. In a system of N storage elements $S_1$ through $S_N$, where $F_J$ is the number or fountain codewords for storage element $S_J$, $F=F_1+F_2+\ldots+F_N$.

V=an estimate of the ratio of storage per fountain codeword (approximation of C/F, $C_1/F_1$, $C_2/F_2$, etc.). Thus, for example, $V \approx C/F$.

$F_{MAX}$=number of fountain codewords allocated to a storage element having the maximum number of codewords assigned thereto.

R=a parameter of the set of fountain codewords selected. R>number of storage devices and usually much greater than the number of storage devices.

L=a rounding factor added to a calculated minimum number of fountain codewords to assure that a minimum number of fountain codewords R will be reached.

$B_K$=a $K^{th}$ capacity band—a $K^{th}$ band of storage capacity allocated among a plurality of storage device.

Int(x)=a rounding down function. In this case, Int(x)=the integer which is the next lower integer than x. The integer part of a whole number. Thus, for example, Int(3.14)=3. For purposes of this document, this function can be interpreted as a rounding up function without departing from embodiments consistent with the present invention.

Fountain codes are an example of erasure codes. Fountain codes have been discussed in the technical literature primarily for use in the encoding data which is transmitted between two points. One of the most extensive uses of fountain codes to date has been in connection with satellite radio transmissions. While it has generally been suggested that fountain encoding could be utilized for more secure data storage by sending fountain codewords to multiple storage devices, to date no known strategy has been proposed for actually accomplishing this. In particular, no strategy is known for efficiently using fountain encoding to encode data for storage in multiple storage devices of varying size.

A storage system utilizing the fountain codes is shown generally in FIG. 1 as system 60 in which a source data block 20 is processed by a fountain code encoder 22 to produce any desired number of fountain codewords 26. It is an attribute of fountain code encoding that almost any desired number of fountain codewords can be generated for any given block of source data. Depending upon the parameters selected for carrying out the fountain code encoding, the original source block of data can generally be recovered if any R fountain codewords are properly recovered or received for decoding.

Continuing with the example of FIG. 1, codewords 30 are stored in storage device $S_1$ which is shown as storage device 32. Similarly, codewords 34 can be stored in storage device $S_2$ which is depicted as storage device 36. Similarly, codewords 38 could be stored in storage device 40 (storage device $S_P$), and fountain codewords 42 can be stored in storage device 44. In this depiction, two fountain codewords are illustrated as being stored in each of storage devices 32 and 36. Three fountain codewords are depicted as being stored in storage device 40, while five fountain codewords are depicted as being stored in storage device 44. In accordance with certain embodiments consistent with the present invention, it is desirable that the storage capacity of each storage device be capable of being well (near fully if possible) utilized. It is further desirable that if any of the storage devices in the storage system should become defective or for some other reason lose the data stored therein, enough fountain codewords will be available in the remaining storage devices to permit full reconstruction of the source data 20. However, these desirable characteristics should not be considered to be limiting constraints on certain embodiments consistent with the present invention.

When data is to be retrieved from the array of storage devices 32, 36 through 40, through 44, only a minimal number (greater than or equal to R) of fountain codewords need to be received at 50 in order to assure that the source data can be reconstructed. Once R or more fountain codewords are received at 50, the fountain code decoder 52 can fully reconstruct the original source data 20 shown as output data 54.

In accordance with certain embodiments consistent with the present invention, a mechanism for distributing or allocating the fountain codewords 26 among the various storage devices which might make up a complete storage system such as 60 is provided under the constraints that loss of the largest storage device in the system will not result in loss of any data stored in the storage system 60. In addition, storage should be approximately allocated according to the size of the disc drives or other storage devices making up the overall storage system, so that the drives or other storage devices have the potential of full or near full utilization, in certain embodiments.

Figure 4:
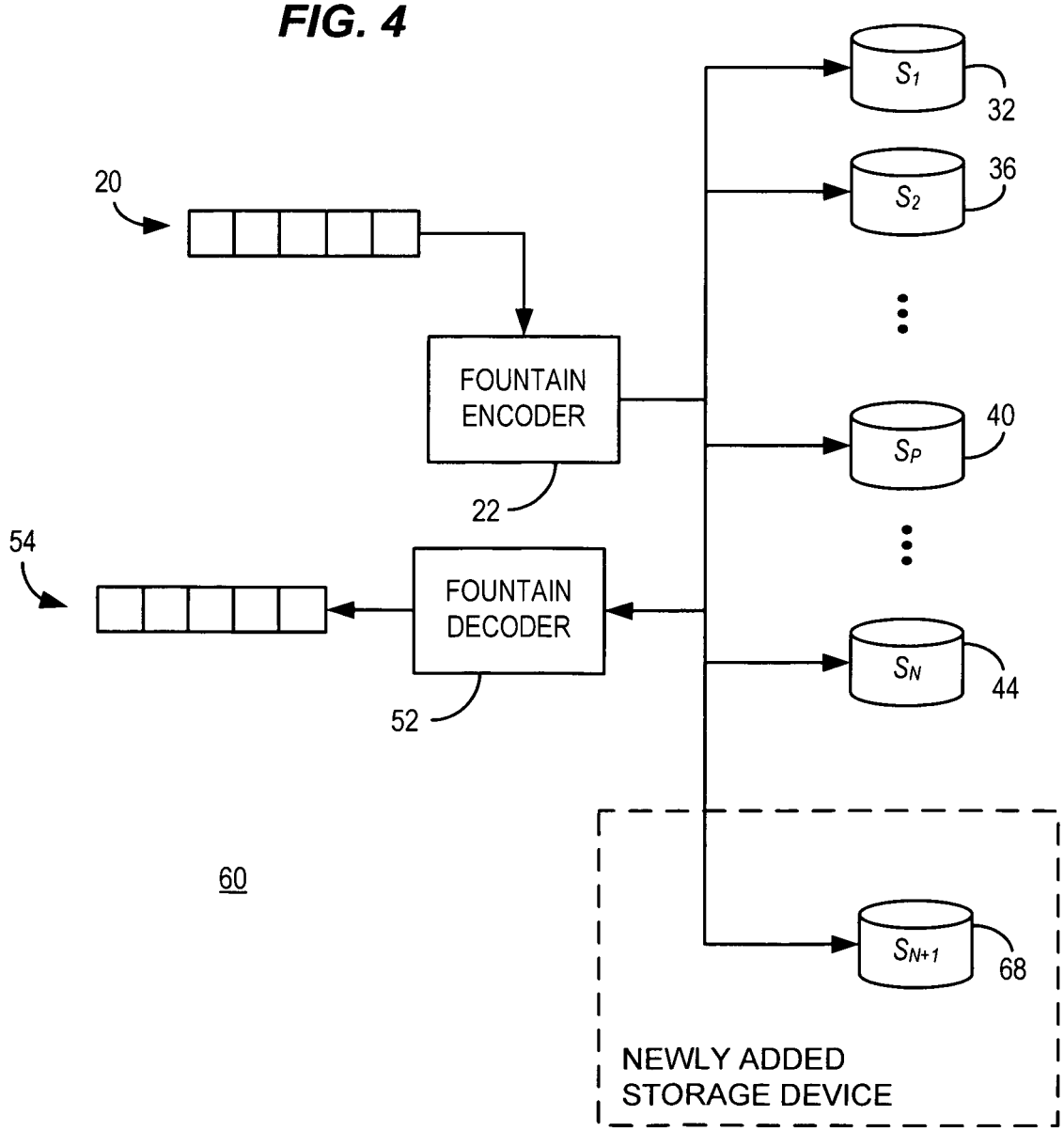
FIG. 4 is a simplified block diagram of storage system 60 illustrating addition of a new storage device $S_{N+1}$, consistent with certain embodiments of the present invention.

For convenience, the system shown in FIG. 1 is referenced herein as system 60 and is shown in simplified form in FIGS. 2-4. In FIG. 2, the individual fountain codewords have been omitted, and the illustration has been generally simplified for convenience. In this illustration, a total of N storage devices is present in system 60. Now consider FIG. 3 which also depicts system 60. In FIG. 3, storage device $S_P$ (device 40) is shown as being damaged, removed, corrupted, or erased. In accordance with embodiments consistent with the present invention, even if storage device 40 is the largest storage device in the system, it is desirable that there be no data loss. Hence, any allocation of fountain codewords among the various storage devices in the system 60 should be made to assure that adequate fountain codewords ($\geq R$) remain available, even without storage device 40, to reconstruct all stored data.

Now also consider FIG. 4, which depicts system 60 with the addition of a newly added storage device 68. In an evolving system where new devices with varying storage capacity may be added, it is also desirable that a newly added storage device be integrated within the existing network in a manner such that it enhances the system 60's resistance to storage device failure, accidental erasure or other loss of data phenomenon. It is further desirable that newly added storage devices be available to assist in reconstruction of data should one of the previously existing storage devices be destroyed, damaged, or accidentally erased. Further, it is desirable that the new storage device be protected by existing storage devices against loss of data.

Figure 5:
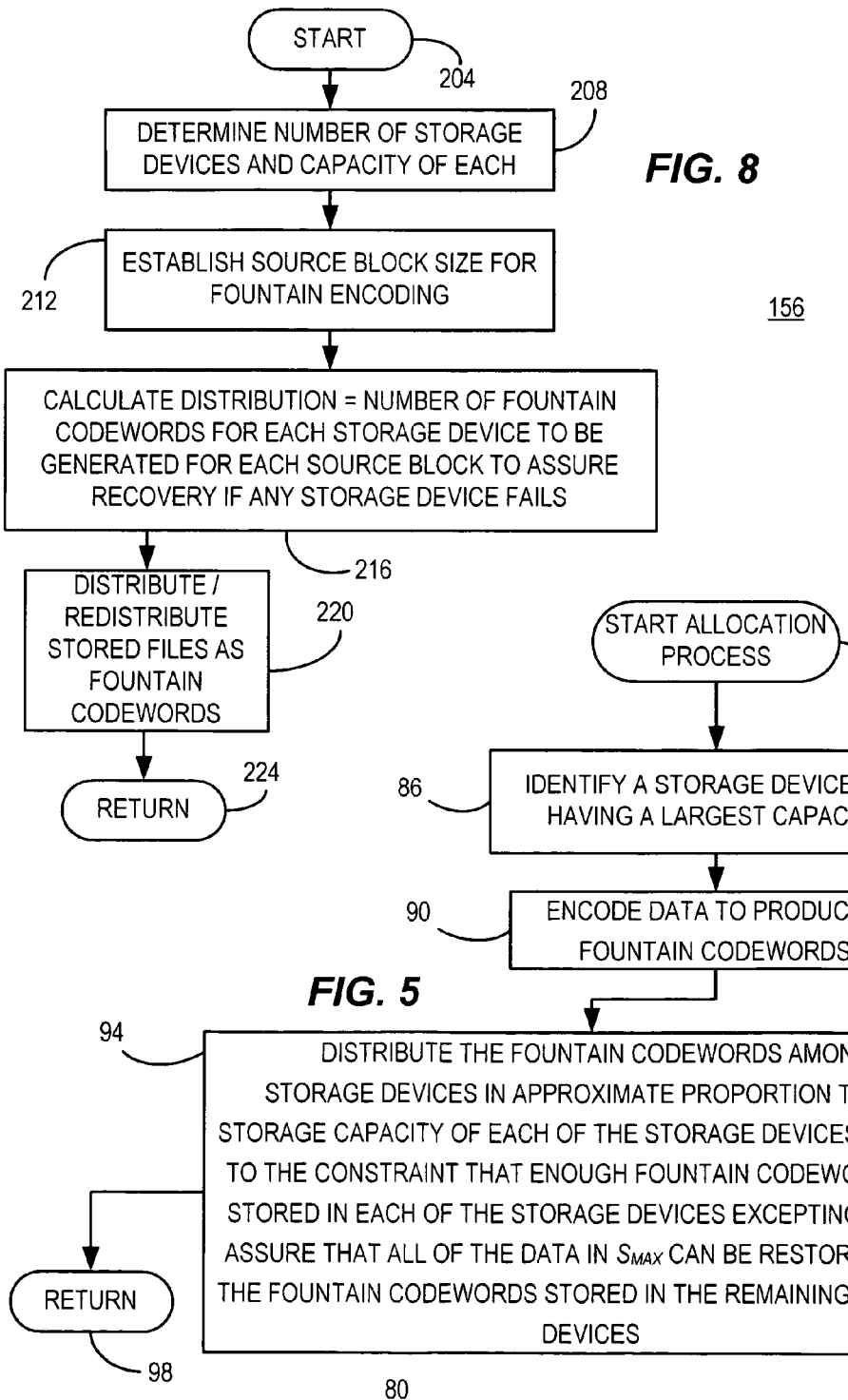
FIG. 5 is a flow chart of an exemplary process 80 for allocation of storage using erasure coding, consistent with certain embodiments of the present invention.

An overall process for allocating and distributing fountain codewords among the N storage devices (or rearrangements after loss or addition of a storage device) is depicted as process 80 of FIG. 5. The allocation process starts at 82 after which the process identifies a storage device $S_{MAX}$ having a largest capacity at 86. Parameters are established at 90 in order to carry out fountain encoding to produce F fountain codewords in a manner that assures that an adequate number of fountain codewords ($\geq R$) will be available (even if $S_{MAX}$ is lost) to carry out full reconstruction of all data as previously described. At 94, the fountain codewords are distributed among the N storage devices in approximate proportion to the storage capacity of each of the storage devices. The distribution is further subject to the constraint that enough fountain codewords are stored in each of the storage devices to assure that if any one storage device, $S_P$ is lost, all of the data in the system can be restored using the fountain codewords stored in the remaining storage devices, by virtue of being able to retrieve at least R fountain codewords from the remaining storage devices. The process then returns at 98. The value of R is a function of the particular fountain encoding algorithm devised for a particular system in consideration of various aspects including the block size of source data that is to be encoded.

The most difficult storage device loss to compensate for is the one with the largest capacity, $S_{MAX}$. Thus, a method for storing data across a plurality of N storage devices $S_1 \ldots S_N$, wherein at least one of the storage devices has a storage capacity that not equal to a storage capacity of others of the storage devices involves identifying a storage device $S_{MAX}$ having a largest capacity of the plurality of storage devices $S_1 \ldots S_N$; encoding the data with an erasure encoder to produce F erasure codewords, where $$F = \sum_{K=1}^{N} F_K$$

with K being a counting integer; and distributing the erasure codewords among the N storage devices $S_1 \ldots S_N$, where $F_K$, the number of codewords assigned to $S_K$, is in approximate proportion to the storage capacity $C_K$ of storage device $S_K$, for each of the N storage devices $S_1 \ldots S_N$ subject to the constraint that if any one storage device, $S_P$ is lost, enough erasure codewords are stored in each of the N−1 remaining storage devices to assure that all of the data in the system can be restored using the erasure codewords stored in the remaining storage devices $S_1 \ldots S_N$ excluding $S_P$. The most difficult case is when $S_P = S_{MAX}$. In accordance with certain embodiments consistent with the present invention, the erasure codewords are fountain codewords. In certain embodiments, the proportion of the number codewords $F_P$ to the capacity $C_P$ of each of the storage devices is a multiple of $(C-C_{MAX})/R$.

Thus, an arrangement for storing data consistent with certain embodiments has a plurality of N storage devices $S_1 \ldots S_N$, wherein at least one of the storage devices has a storage capacity that not equal to a storage capacity of others of the storage devices. A storage device $S_{MAX}$ has a largest capacity of the plurality of storage devices $S_1 \ldots S_N$. A fountain encoder encodes the data into F fountain codewords, wherein $$F = \sum_{K=1}^{N} F_K$$

with K being a counting integer. The fountain encoder distributes the fountain codewords among the N storage devices $S_1 \ldots S_N$ in approximate proportion to the storage capacity $C_K$ of each of the N storage devices $S_1 \ldots S_N$ subject to the constraint that enough fountain codewords are stored in each of the N storage devices, to assure that all of the data in all of the N storage devices can be recovered if any one of the N storage devices is lost, using the fountain codewords stored in the remaining storage devices $S_1 \ldots S_N$ excluding the lost device, even if it is $S_{MAX}$.

Further, an arrangement for storing data consistent with certain embodiments includes a plurality of N storage devices $S_1 \ldots S_N$, wherein at least one of the storage devices has a storage capacity that not equal to a storage capacity of others of the storage devices. A storage device $S_{MAX}$ has a largest capacity of the plurality of storage devices $S_1 \ldots S_N$. A fountain or other erasure encoder encodes the data into F fountain codewords (or erasure codewords), wherein $$F = \sum_{K=1}^{N} F_K$$

with K being a counting integer. The fountain encoder (or other erasure encoder) distributes the codewords among the N storage devices $S_1 \ldots S_N$ in approximate proportion to the storage capacity $C_K$ of each of the N storage devices $S_1 \ldots S_N$ subject to the constraint that enough codewords are stored in each of the N storage devices excepting $S_{MAX}$, to assure that all of the data in $S_{MAX}$ can be restored using the codewords stored in the remaining storage devices $S_1 \ldots S_N$ excluding $S_{MAX}$.

Figure 6:
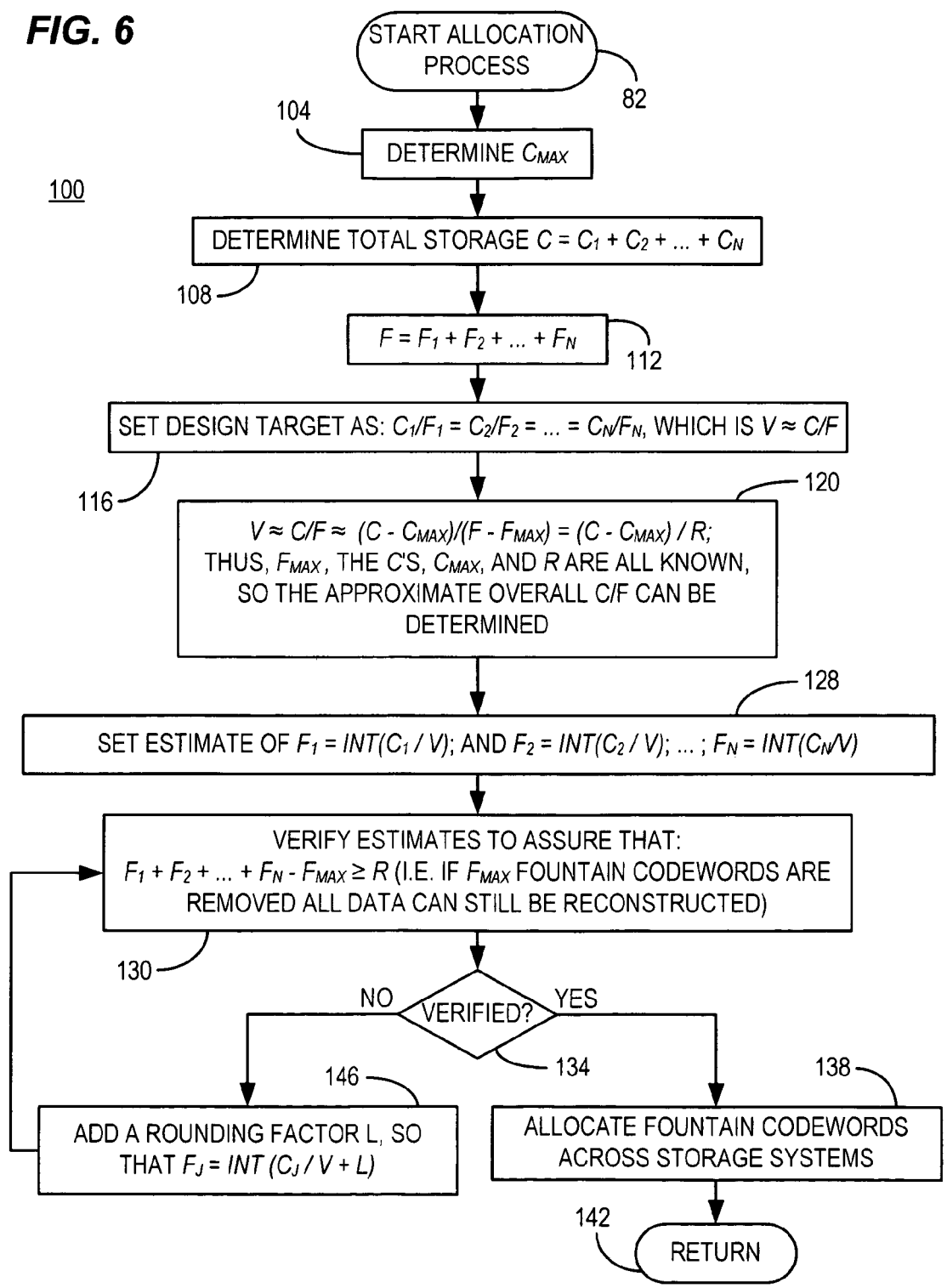
FIG. 6 is a more detailed flow chart of an exemplary allocation process 100 using erasure coding, consistent with certain embodiments of the present invention.

A more detailed algorithm for this process is depicted in FIG. 6 as process 100. This process starts at 82 after which the capacity $C_{MAX}$ of the largest storage device $S_{MAX}$ is determined at 104. The total storage of all of the storage devices $C_1$ through $C_N$ is determined at 108. Knowing R, the number of codewords needed to reconstruct the original data, and the capacities C and $C_1$ through $C_N$, we need to determine the number of codewords $F_P$ to assign to each storage devices $S_P$. The total number of fountain codewords to be generated to fill all the disc drives or other storage devices is given by F at 112 as the sum of the individual fountain codewords allocated to each individual storage device 1 through N. The design target is established such that the ratio of capacity to fountain codewords ($C_P/F_P$) is approximately equal for each of the individual storage devices (each $S_P$) as well as the total capacity C at 116. At 120, the ratio V is determined using the parameter R established for the fountain encoding selected for use. V is approximated as:

$$V \approx C/F \approx (C-C_{MAX})/(F-F_{MAX}) = (C-C_{MAX})/R.$$

This establishes the relationship between R, the C's, $S_{MAX}$ and $C_{MAX}$, as well as V so that an initial estimate of the overall value of ratio V can be determined.

The individual estimates for the number of fountain codewords allocated to each of the storage devices can then be determined by taking the integer value of the capacity of the particular storage device and dividing it by V as illustrated at 128 and given by:

$$F_1 = Int(C_1/V); \text{ and } F_2 = Int(C_2/V); \ldots ; F_N = Int(C_N/V).$$

This provides an estimate or approximation of the number of fountain codewords that should be allocated to each of the individual storage devices $S_1$ through $S_N$. Since these are estimates, it should be verified that:

$$F_1 + F_2 + \ldots + F_N - F_{MAX} \geq R$$

and that $$F_{MAX} \geq F_P \text{ for } P=1 \text{ through } N$$

That is, if $F_{MAX}$, the maximum number of codewords assigned to any given storage device, codewords are removed all data can still be reconstructed. Thus, at 130, the initial estimates are checked to assure that the sum of all fountain codes minus the number of fountain codes allocated to $S_{MAX}$ ($F_{MAX}$) is greater than or equal to R so that it is assured that if $F_{MAX}$ fountain codes are removed by virtue of loss of $S_{MAX}$ all of the data can still be reconstructed. If this is verified at 134, the fountain codewords can be allocated across the storage systems at 138, and the process returns at 142.

However, if it is not verified at 134, an integer rounding factor L can be added at 146 to provide additional codewords to each or some of the storage devices to assure that for any particular storage device $S_J$ that $F_J$ can be determined by:

$$F_J = Int(C_J/V+L), \text{ and retry until } F - F_{MAX} \geq R.$$

The process then returns to 130 to verify that enough fountain codewords have been generated. The process iterates until the conditions of 130 are met, at which point, the fountain codewords are allocated according to the values of $F_J$ and the process returns. By use of the above process, it can be guaranteed that even under the constraint that the largest capacity storage device $S_{MAX}$ is lost, no data will be compromised.

In certain applications, iteration of the number of codes and testing may not be required if it can be predetermined how much adjustment to the estimate is needed to assure that adequate numbers of fountain codewords are available. In such case, the estimate can simply be refined by addition of L as a part of the initial estimating process.

Thus, a method of allocating storage for storing data across a plurality of N storage devices $S_1 \ldots S_N$, wherein at least one of the storage devices has a storage capacity that is not equal to a storage capacity of others of the storage devices involves determining a maximum capacity $C_{MAX}$ of a storage device $S_{MAX}$ having a largest capacity of the plurality of storage devices $S_1 \ldots S_N$; determining a total storage capacity C of all of the plurality of storage devices $S_1 \ldots S_N$ as $$C = \sum_{K=1}^{N} C_K,$$

where K is a counting integer; defining a maximum total number of fountain codewords $$F = \sum_{K=1}^{N} F_K$$

that could be stored in the plurality of storage devices $S_1 \ldots S_N$; defining $F_{MAX}$ as a maximum number of fountain codewords that would be lost if the data in $S_{MAX}$ is lost; estimating a target ratio of capacity to fountain codewords V as $V \approx C/F \approx (C-C_{MAX})/(F-F_{MAX}) \approx (C-C_{MAX})/R$, where R is a number of fountain codewords required to recover $C_{MAX}$ if the data in $S_{MAX}$ is lost; using the estimate of the value of V to estimate the values of $F_1 \ldots F_N$ as $F_K = \text{Int}(C_K/V)$; adjusting the estimated values of $F_1 \ldots F_N$ by addition of a rounding factor to assure that $$\left(\sum_{K=1}^{N} F_K\right) - F_{MAX} \geq R;$$

and allocating fountain codewords storing data to the storage devices $S_1 \ldots S_N$ in proportion to the estimated values of $F_1 \ldots F_N$.

It should be noted, however, that the present allocation method is contingent upon there being an adequate amount of storage available after loss of a storage device in the remaining storage devices to provide at least R fountain codewords for any stored data so that the stored data can be reconstructed. This implies that the summation of storage available on all devices excluding $S_{MAX}$ should total to at least the capacity of $S_{MAX}$ which is $C_{MAX}$. If this condition is not met, the recovery of loss of the largest storage device cannot be assured; however, this may be acceptable in certain applications and the process modified accordingly if it is acceptable in a particular application for certain data to be expendable.

Figure 7:
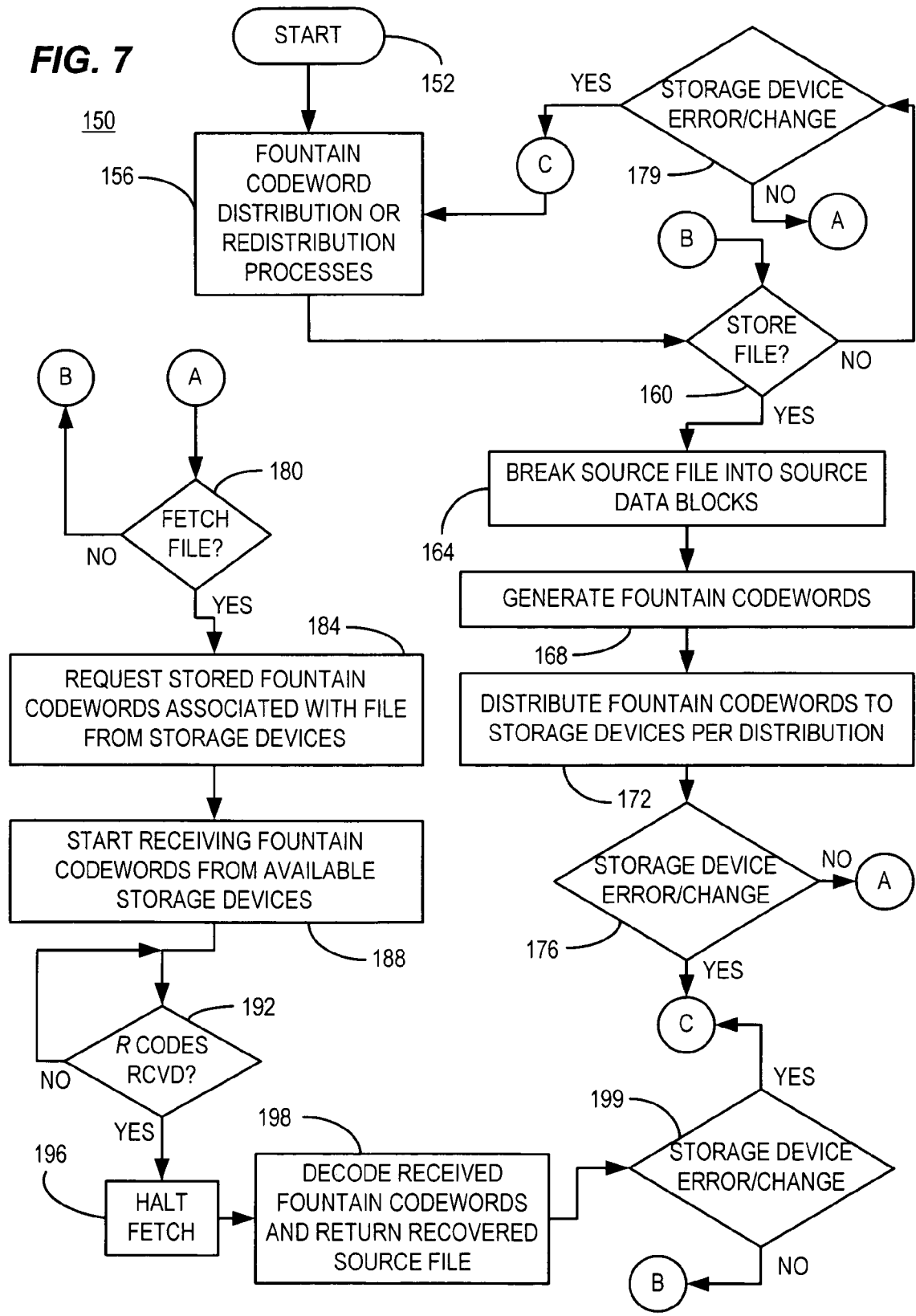
FIG. 7 is a flow chart of an exemplary process 150 for allocation, storage and retrieval of erasure encoded data, consistent with certain embodiments of the present invention.

Process 100 (or process 80) is carried out at initialization of a storage system having multiple storage devices. The process can also be carried out whenever a redistribution needs to be carried out as a result of loss of a storage device or acquisition of a new storage device within storage system 60. Referring to FIG. 7, an overall process 150 for allocating fountain codewords, storage and retrieval of files is depicted starting at 152. At 156, the initial fountain codeword distribution process is carried out so that the encoder and storage device controllers can know how to allocate and distribute fountain codewords whenever source data is to be stored. If a file is to be stored at 160, the file is broken into source data blocks at 164. The fountain code encoder generates fountain codewords at 168 for each of the data blocks produced at 164. Those fountain codewords are then distributed to the storage devices in accordance with the distribution determined at 156. If no error occurs in the storage process and no change is detected in the configuration of the storage system at 176, the system determines if a file is to be fetched at 180. If so, the file is associated with a collection of stored fountain codewords and those stored fountain codewords are requested from the storage devices.

At 188, fountain codewords are received from the available storage devices until it is determined at 192 that R codewords have been received. At this point, it is possible to halt the process of fetching additional codewords at 196 if desired, and the fountain decoder can decode the received fountain codewords and return the recovered source file at 198. A determination can then be made at 199 as to whether or not the process was successful and/or a storage device error or change has taken place. If not, control returns to 160 to determine if a file is to be stored.

As a convenience in depicting the process, if a file is not to be stored at 160, control passes first to 179 where a check is made to determine if a storage device error or change has taken place. If so, control passes to 156 where a redistribution process is carried out. If not, control passes to 180 where a determination is made as to whether or not a file is to be fetched. If no file is to be fetched at 180, control passes back to 160 to determine if a file is to be stored. Those skilled in the art will recognize that in a physical system, the process depicted may not literally be followed, but rather the system may await an instruction to either store or fetch a file. In the event a change in the storage system is detected at either 176 or 199, control passes back to 156 where a redistribution process is carried out to determine how fountain codewords are distributed within the system under a new configuration.

There are many ways to view the fountain codeword distribution and redistribution processes within the constraints defined above, as depicted in process 80 and in process 100. This process can be further illustrated in FIG. 8 as process 156 starting at 204. At 208, the number of storage devices and the capacity of each within system 60 is ascertained. A source block size for each fountain encoding is then established at 212 (This might be fixed at system design time rather than here. If this is determined here, it may also determine various other fountain code parameters, such as R.). The distribution can be calculated in order to determine the number of fountain codewords for each storage device to be generated for each source block so that it can be assured that all data can be recovered in the event of any storage device failure at 216. The fountain codewords are then generated and distributed or redistributed at 220, and the process returns at 224.

Figure 9:
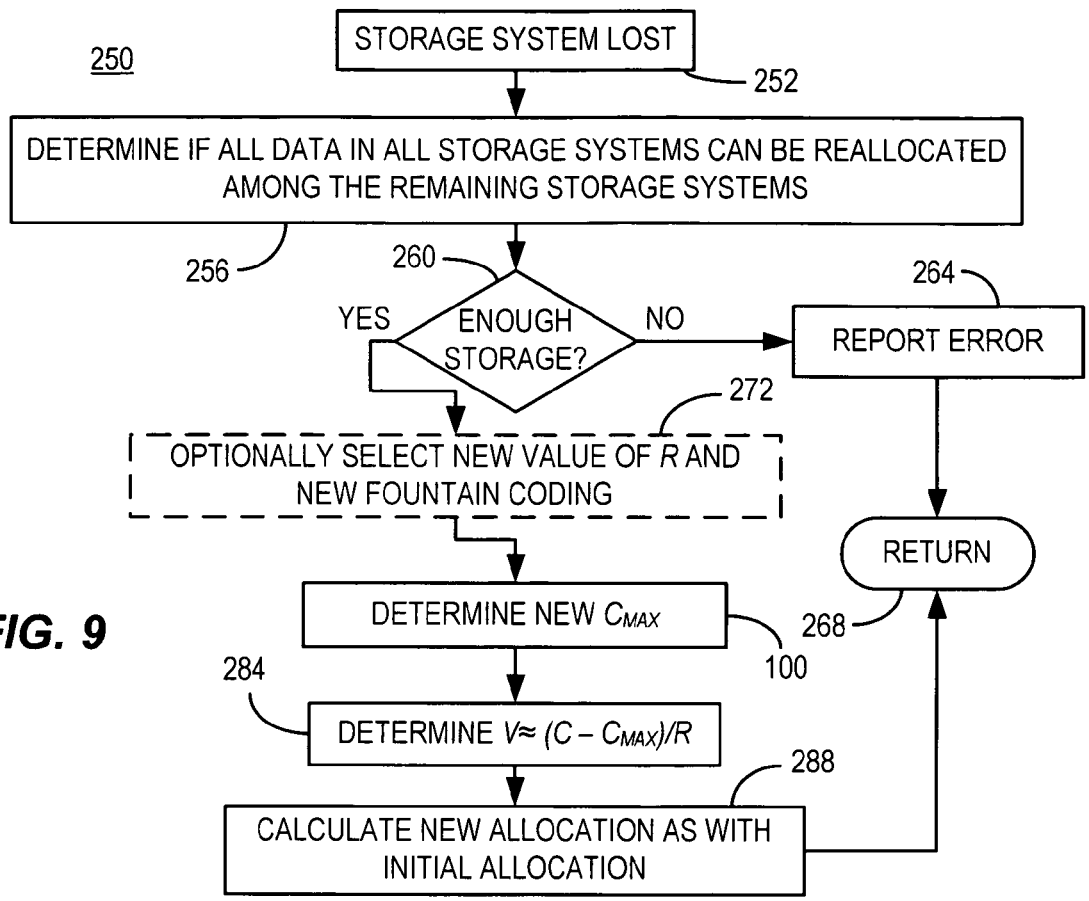
FIG. 9 is a flow chart of an exemplary process 250 for management of loss of a storage device or system, consistent with certain embodiments of the present invention.

When a storage device is lost from system 60, several possible courses of action can be implemented. One such course of action is depicted in FIG. 9 as process 250 starting at 252 where it is determined that a storage system has been lost. Such determination can be made by any suitable mechanism including, but not limited to, verifying a response from each storage device at prescribed intervals or when codewords are stored or fetched. At 256, a determination is made as to whether or not all data in all storage systems can be reconstructed, recoded, and repartitioned among the remaining storage systems in view of the loss of a particular storage device or system. If not enough storage exists at 260, an error can be reported or other error trapping action can be carried out at 264, and the process returns at 268. (In other embodiments, the process can proceed subject to there being no guarantee that all data is recoverable.) If, however, enough storage exists at 260, and a new value of R and a new fountain coding scheme can be selected at 272. A new value of $C_{MAX}$ can then be determined at 280, and a new value of V can be determined at 284. This provides enough information to calculate a new allocation as with the initial allocation at 288. The process can then return for storage of the fountain codes.

Another option when a storage system is lost is to discard files according to some pre-arranged algorithm until the data does fit in the remaining space.

Figure 10:
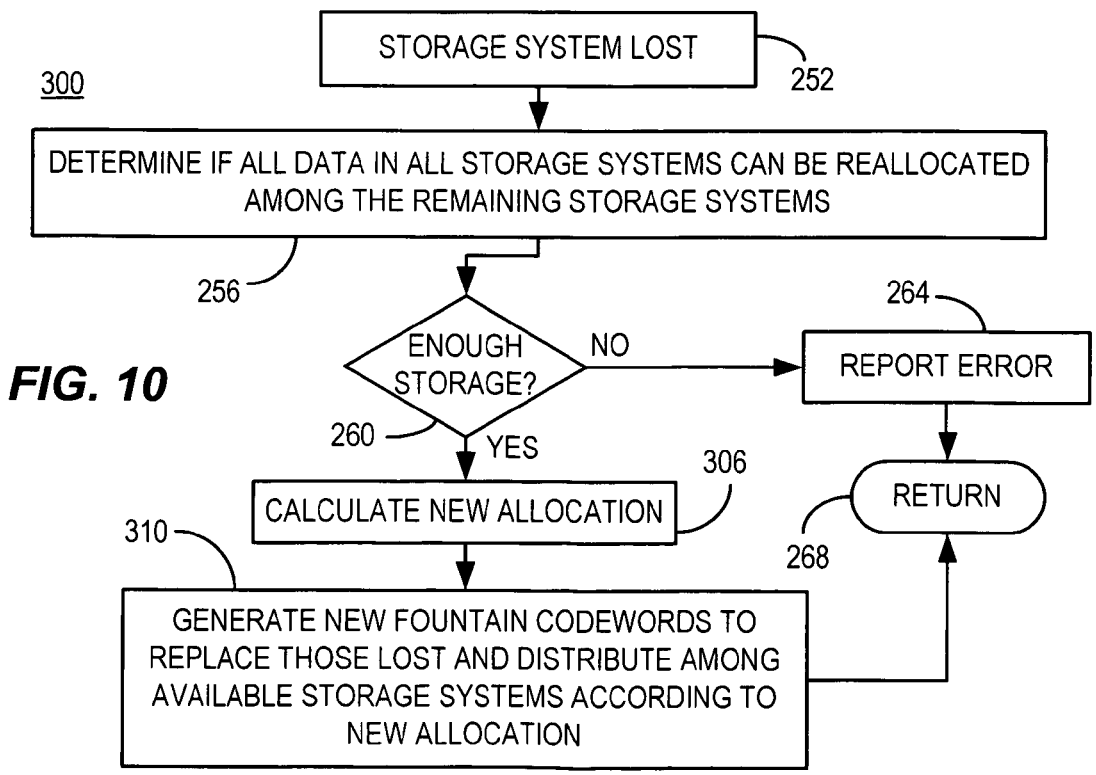
FIG. 10 is a flow chart of another exemplary process 300 for management of loss of a storage device or system, consistent with certain embodiments of the present invention.

FIG. 10 depicts another process for dealing with loss of a storage device or system. This process is referenced at process 300 and starts out identically to the prior process 250 of FIG. 9. However, if enough storage is available at 260, a new allocation can be calculated at 306 and new fountain codewords to replace those lost can be generated and distributed among the available storage systems according to the new allocation. This process differs from process 250 in that a whole new allocation is not carried out. Instead, only the missing fountain codewords are generated and redistributed according to a new allocation scheme.

Several processes can also be utilized to deal with a circumstance wherein a new storage device is added to the system. One such process is depicted as process 320 of FIG. 11. When it is determined at 324 that a new storage device is added (Such determination can be made by any suitable mechanism including, but not limited to, verifying a response from each storage device at prescribed intervals or when codewords are stored or fetched, or via other monitoring provided by a programmed processor), a new capacity C can be calculated as the previous capacity plus the new capacity at 328. A new fountain coding arrangement with a new R value can be selected at 332. A new value of $C_{MAX}$ can be determined at 336, and the value of V can be determined at 340 as the new C minus the new $C_{MAX}$, then divided by the new R. At 344, the fountain codewords can be reallocated as with the initial allocation using the new values of the relevant variables as modified by the change in capacity. Each stored file can then be reconstructed according to the new distribution at 348, and the process returns at 352.

FIG. 12 depicts an alternative process 360 for dealing with the addition of a new storage system. When it is determined that a new storage system has been added at 364, the new capacity can be calculated at 328 and new values of C, $C_{MAX}$ and V can be calculated at 336 and 340 as before. At 380, however, according to the process 360, fountain codewords are moved from other storage systems to the new storage system within the allocation constraints. Thus, rather than a complete reallocation, process 360 moves existing codewords to the new storage system in order to more rapidly affect the allocation. At 384, new fountain codewords are generated where needed to assure recovery if a storage system fails. Since the addition of a new storage system or device may affect the availability of an adequate number R of codewords, the new fountain codewords generated at 384 are generated according to a specified fountain coding scheme and distributed in order to assure recovery of any lost data. The process then returns at 390.

Thus, according to certain of the above example embodiments, when it is determined that an additional storage device $S_{N+1}$ is available for storage of the codewords, the codewords are reallocated across the plurality of storage devices $S_1 \ldots S_{N+1}$. In certain embodiments, the reallocating comprises moving codewords from, certain of the storage devices $S_1 \ldots S_N$ to storage device $S_{N+1}$. In certain embodiments, the reallocation is carried out subject to the constraint that $$\left(\sum_{K=1}^{N+1} F_K\right) - F_{\text{MAX}} \geq R,$$

where $F_{MAX}$ is the number of codewords to be stored on the largest of storage devices $S_1 \ldots S_{N+1}$.

In certain embodiments, the reallocation involves: determining a new maximum capacity $C_{MAX}$ of a storage device $S_{MAX}$ having a largest capacity of the plurality of storage devices $S_1 \ldots S_{N+1}$; determining a total storage capacity C of all of the plurality of storage devices $S_1 \ldots S_{N+1}$ as $$C = \sum_{K=1}^{N+1} C_K;$$

defining a maximum total number of fountain codewords $$F = \sum_{K=1}^{N+1} F_K$$

that could be stored in the plurality of storage devices $S_1 \ldots S_{N+1}$; defining $F_{MAX}$ as a maximum number of fountain codewords that would be lost if the data in $S_{MAX}$ is lost; estimating a revised target ratio of capacity to fountain codewords V as $V \approx C/F \approx (C-C_{MAX})/(F-F_{MAX}) \approx (C-C_{MAX})/R$, where R is a number of fountain codewords required to recover $C_{MAX}$ if the data in $S_{MAX}$ is lost; using the estimate of the value of V to estimate the values of $F_1 \ldots F_{N+1}$ as $F_K = \text{Int}(C_K/V)$; adjusting the estimated values of $F_1 \ldots F_{N+1}$ by addition of a rounding factor to assure that $$\left(\sum_{K=1}^{N+1} F_K\right) - F_{\text{MAX}} \geq R;$$

and allocating fountain codewords storing data to the storage devices $S_1 \ldots S_{N+1}$ in proportion to the estimated values of $F_1 \ldots F_{N+1}$.

In certain embodiments, the method further involves determining that storage device $S_P$, being one of storage devices $S_1 \ldots S_N$ is no longer available for storage of the codewords; and reallocating the codewords across the plurality of storage devices $S_1 \ldots S_N$ excluding $S_P$.

In certain embodiments, the reallocating involves calculating a new allocation; generating new codewords; and distributing the new codewords among the storage devices $S_1 \ldots S_N$ excluding $S_P$. In certain embodiments, the reallocation is carried out subject to the constraint that $$\left(\sum_{K=1}^{N} F_K\right) - F_P - F_{\text{MAX}} \geq R,$$

where $F_P$ is the number of codewords that were allocated to storage device $S_P$ and $F_{MAX}$ is the number of codewords to be stored on the largest of storage devices $S_1 \ldots S_N$, excluding $S_P$ In certain embodiments, the reallocation involves determining a new maximum capacity $C_{MAX}$ of a storage device $S_{MAX}$ having a largest capacity of the plurality of storage devices $S_1 \ldots S_N$ excluding $S_P$; determining a total storage capacity C of all of the plurality of storage devices $S_1 \ldots S_N$ excluding $S_P$ as $$C = \left(\sum_{K=1}^{N} C_K\right) - C_P;$$

defining a maximum total number of fountain codewords $$F = \left(\sum_{K=1}^{N} F_K\right) - F_P$$

that could be stored in the plurality of storage devices $S_1 \ldots S_N$ excluding $S_P$; defining $F_{MAX}$ as a maximum number of fountain codewords that would be lost if the data in $S_{MAX}$ is lost; estimating a revised target ratio of capacity to fountain codewords V as $V \approx C/F \approx (C-C_{MAX})/(F-F_{MAX}) \approx (C-C_{MAX})/R$, where R is a number of fountain codewords required to recover $C_{MAX}$ if the data in $S_{MAX}$ is lost; using the estimate of the value of V to estimate the values of $F_1 \ldots F_{N+1}$ as $F_K = \text{Int}(C_K/V)$ for $S_1 \ldots S_N$ excluding $S_P$; adjusting the estimated values of $F_1 \ldots F_{N+1}$ by addition of a rounding factor to assure that $$\left(\sum_{K=1}^{N+1} F_K\right) - F_{MAX} \geq R$$

for each of $S_1 \ldots S_N$ excluding $S_P$; and allocating fountain codewords storing data to the storage devices $S_1 \ldots S_N$ excluding $S_P$ in proportion to the estimated values of $F_1 \ldots F_N$.

In certain embodiments, the method further involves determining that storage device $S_P$, being one of storage devices $S_1 \ldots S_N$ is no longer available for storage of the codewords; determining if it is possible to reallocate codewords representing all stored data on the remaining storage devices $S_1 \ldots S_N$ excluding $S_P$; and if not, establishing that an error condition exists.

In another alternative embodiment, after a consolidation of data following loss of a drive, data can be deleted according to some user/system defined plan (such as deleting already viewed video, or old versions of files, etc.) to make the necessary room on the new protected system for the essential content from the old protected system. A protected system being a system implemented such that if one drive dies, the system can restore the data. When one drive has died, the system is no longer protected. It can still retrieve all the data, but another failure will make for complete loss. It isn't protected until it reinitializes with the new allocation.

Many further variations will occur to those skilled in the art upon consideration of the present teachings.

Hence, if the fountain codewords and R are unchanged, in one embodiment certain codes are simply removed from each storage device and those codewords are stored on the newly added storage device. In fact, if under a revised calculation following addition of the storage device, if $F_{MAX} < F-R$ (that is if the new allocation of codewords has its $F_{MAX}$ lower than the prior $F_{MAX}$, i.e. $F_{MAXNEW} < F_{MAXOLD}$, then no new codes need to be generated at all—and in fact, some may be able to be discarded.

In each example above, it should be noted that the number of available fountain codewords should always be $\geq R$. Clearly, providing more codewords above and beyond R provides greater insurance against data loss, but does so at the expense of storage efficiency, since more codewords per storage device would be required.

Figure 13:
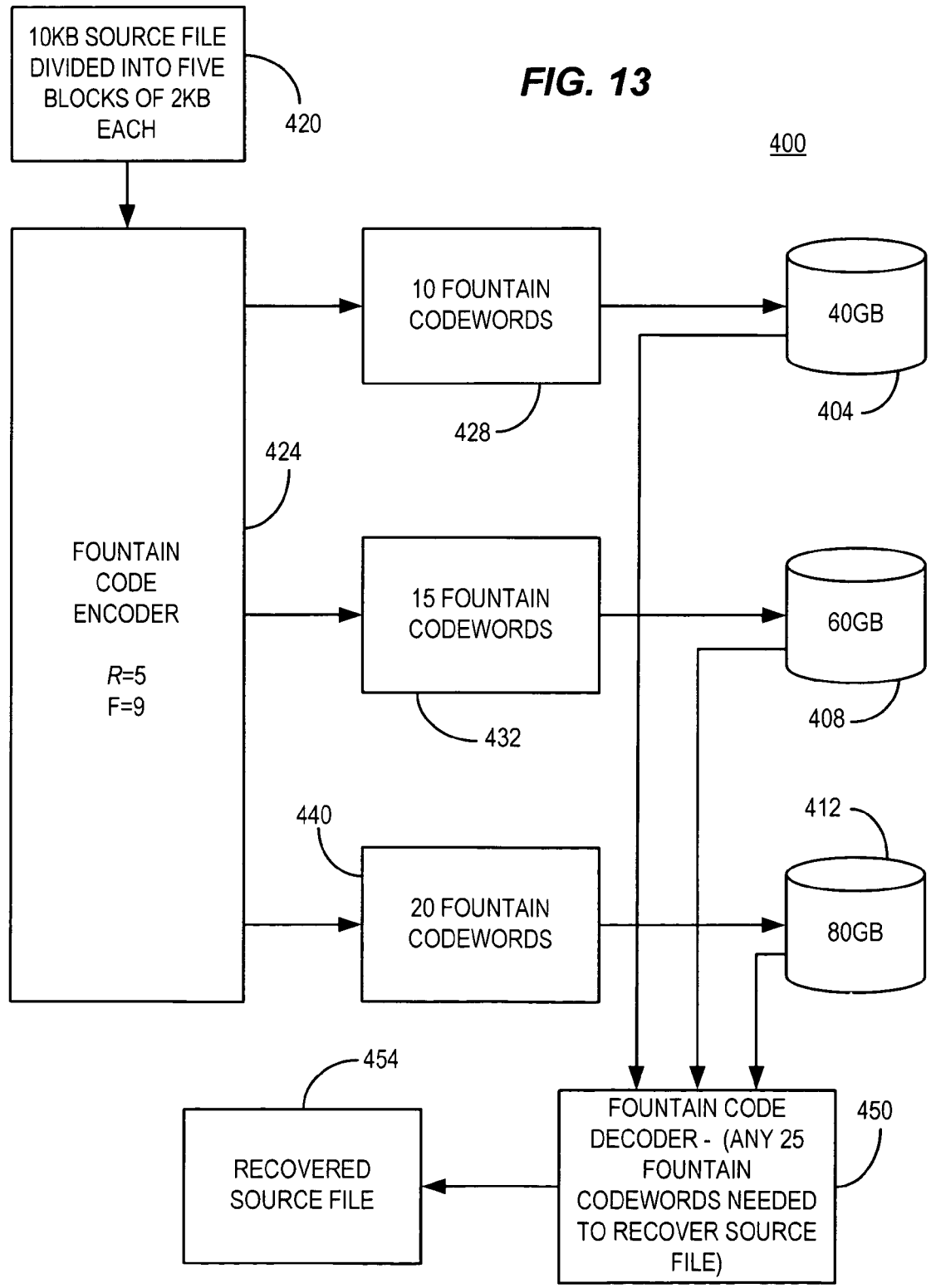
FIG. 13 is a block diagram of an example storage system illustrating an allocation process, consistent with certain embodiments of the present invention.

An example system 400 is shown in FIG. 13. In this example system, three storage devices are shown. The storage devices are respectively a 40 GB storage device 404, a 60 GB storage device 408, and an 80 GB storage device 412. For this example, we will assume that each input source file is divided into blocks of 2 KB each at 420 for encoding by fountain code encoder 424.

For the simple system depicted in FIG. 13, N=3 storage devices—$S_1$, $S_2$ and $S_3$, illustrated as 404, 408 and 412. Also assume a value of R of 5 for the fountain encoding. In this example:

$C_1 = 40$ GB;

$C_2 = 60$ GB; and $C_3 = 80$ GB.

Clearly, $C_{MAX} = 80$ GB, and $C = C_1 + C_2 + C_3 = 180$ GB.

Now, selecting a fountain coding scheme constrained by R=5, on input blocks of 2KB each, then:

$V \approx (C - C_{MAX})/R = (180-80)/5 = 20$;

$F_1 = \text{int}(C_1/V) = 40/20 = 2$;

$F_2 = \text{int}(C_2/V) = 60/20 = 3$;

$F_3 = \text{int}(C_3/V) = 80/20 = 4$;

$F = F_1 + F_2 + F_3 = 2+3+4 = 9$; and $F_{MAX} = 4$.

Hence, in this example, for each input block of data (2KB) nine fountain codewords are created. Since the constraint of providing adequate codewords if $S_{MAX}$ is lost is met, there is no need to add a factor L to any or all of the values of $F_J$.

In accord with this example, in order to store the example 10 KB source file at 420, the source file is divided into 2 KB source file blocks (5 such blocks total) which are each encoded by fountain code encoder 424 to produce 2 fountain codewords 428 for storage device 404, 10 codewords in total, 3 fountain codewords 432 for storage device 408, 15 codewords in total, and 4 fountain codewords 440 for storage device 412, 20 codewords in total. In order to recover the stored source file, any 5 fountain codewords for each of the 2 KB source file blocks can be retrieved from any of the storage devices at 450, for a total of 25 codewords, and the source file can be recovered using a fountain decoder at 454. The details of selection of a particular variant of fountain encoding and selection of a particular value of R is well documented in the literature and need not be repeated here. Moreover, the present invention may well be implemented using other erasure codes without departing from the invention.

It is noted with this example that even if the largest storage device 412 should fail or be accidentally erased, enough fountain codewords (R=5) are available from the combination of storage device 404 and 408 in order to recreate the 10 KB source file 420.

Now consider a second identical example except that:

$C_1 = 30$ GB;

$C_2 = 50$ GB; and $C_3 = 80$ GB.

Clearly, $C_{MAX} = 80$ GB, and $C = C_1 + C_2 + C_3 = 160$ GB.

Again, selecting a fountain coding scheme constrained by R=5, on input blocks of 2 KB each, then:

$V \approx (C - C_{MAX})/R = (160-80)/5 = 16$;

estimate $F_1 \approx \text{int}(C_1/V) = \text{int}(30/16) = \text{int}(1.88) = 1$;

estimate $F_2 \approx \text{int}(C_2/V) = \text{int}(50/16) = \text{int}(3.13) = 3$;

estimate $F_3 \approx \text{int}(C_3/V) = \text{int}(80/18) = \text{int}(4.44) = 4$;

$F = F_1 + F_2 + F_3 = 1 + 3 + 4 = 8$;

$F_{MAX} = 4$.

Now test the estimates. Is the criteria $F_1 + F_2 + \ldots + F_N - F_{MAX} \geq R$ met?

$1 + 3 + 4 - F_{MAX} = 1 + 3 + 4 - 4 = 4$

4 < R, thus the criteria is not met.

In this example, since the constraint of providing adequate codewords if $S_{MAX}$ is lost is not yet met, a factor L can be added to any or all of the values of $F_J$ as follows:

$F_1 = \text{int}(1.88 + L)$;

$F_2 = \text{int}(3.13 + L)$; and $F_3 = \text{int}(4.44 + L)$.

Let L=0.5; then refine the estimate as:

$F_1 = \text{int}(1.88 + L) = 2$;

$F_2 = \text{int}(3.13 + L) = 3$; and $F_3 = \text{int}(4.44 + L) = 4$.

Now repeat the test. Is the criteria $F_1 + F_2 + \ldots + F_N - F_{MAX} \geq R$ met?

$2 + 3 + 4 - F_{MAX} = 2 + 3 + 4 - 4 = 5$ $5 \geq R$, thus the criteria is met.

In accord with this example, in order to store the example 10 KB source file, the source file is divided into 2 KB source file blocks (5 such blocks) which are encoded by the fountain code encoder to produce 10 fountain codewords for storage in $S_1$, 15 fountain codewords for storage in storage device $S_2$, and 20 fountain codewords for storage in storage device $S_3$. In order to recover the stored source file, any 5 fountain codewords for each block can be retrieved from any of the storage devices, and the source file can be recovered using the fountain decoder. Again, the details of selection of a particular variant of fountain encoding and selection of a particular value of R is well documented in the literature and need not be repeated here. Moreover, the present invention may well be implemented using other erasure codes without departing from the invention.

It is noted with this example that even if the largest storage device $S_3$ should fail or be accidentally erased, enough fountain codewords (R=5) are available from the combination of storage device $S_1$ and $S_2$ in order to recreate the 10 KB source file 420.

It is noted that under certain circumstances, there may be no solution to the problem of assuring that loss of the largest drive is to be recoverable. For example, consider a storage system with two 20 GB drives and one 100. Clearly, the above techniques do not account for a mechanism to store enough codewords on the two 20 GB drives to recover 100 GB. Thus, the embodiments described above work best when there are a large number of storage devices, and wherein the capacity of all drives excluding $S_{MAX}$ exceeds the capacity $C_{MAX}$. It is also noted that if with varying capacities, some of the drives may not be used completely if all of the source data is to be assured protection. However, since most such systems have excess capacity, this is not likely to be of major concern. Moreover, the potentially unused capacity can be utilized for simple redundant storage of certain information to more fully utilize the full storage capacity. In another variation, the unused portion of the drives could be combined into a separate redundant system, except with fewer devices. This could be done until all capacity that spans more than one drive is consumed. This would allow some otherwise unused space to be efficiently utilized.

Figure 14:
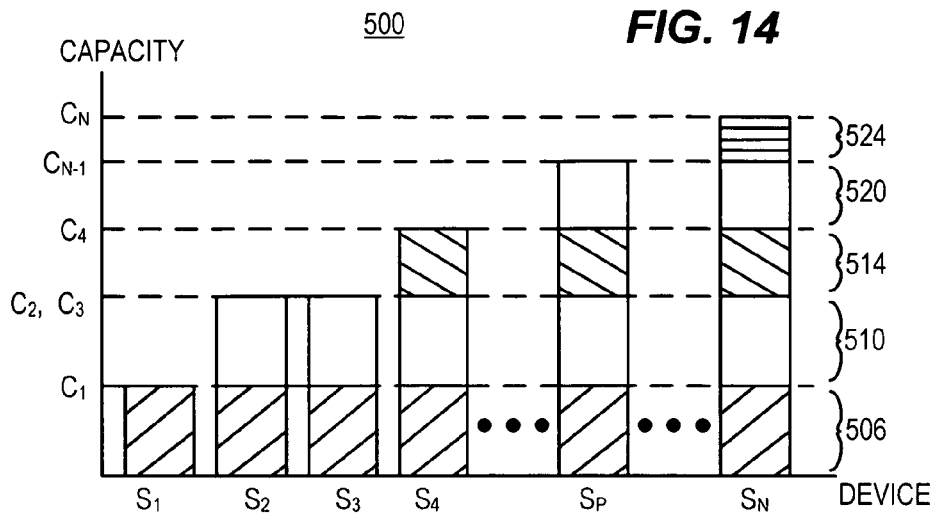
FIG. 14 is a graphical representation of a banded storage allocation arrangement, consistent with certain embodiments of the present invention.

In an alternative implementation, instead of allocating storage as described above, the capacity can be allocated using a banding approach as follows:

Suppose there are N storage systems $S \ldots S_N$, with corresponding capacities $C_1 \ldots C_N$, such that $C_1 \leq C_2 < \ldots \leq C_N$, as depicted graphically as 500 in FIG. 14. In this embodiment, the system can be implemented using up to N-1 backed up bands on each of the storage devices. The first band 506 would have capacity C1, and all drives would participate. In this case R could ideally (but not necessarily) be chosen such that R=N-1, (or some multiple thereof). For band 506, allocation of erasure codewords (e.g., fountain codewords or other erasure codewords) across all storage devices is uniform.

The second band 510 has capacity $C_2 - C_1$, and could ideally, but not necessarily, be selected such that $R \geq N-2$. In this example, storage devices $S_2$ and $S_3$ have equal capacity $C_2 = C_3$. The next band 514 has capacity $C_4 - C_3$, and so on until all bands are depleted.

Similarly each band would have capacity $C_J - C_{J-1}$, and have R ideally equal to N-J. If there are adjacent $C_J$, $C_{J-1}$ that are equal, then they are dealt with as a single band. The final band encompassing multiple drives may be reached (e.g., band 520 as shown) at a certain point. Beyond this point, in range 524, the ability to provide protection to the data using the present arrangement ends because the other systems are already full. However, depending upon the exact storage capacity of the storage devices in a particular system, this arrangement may provide greater storage utilization.

In the present banded implementation in particular, any suitable erasure coding arrangement can be used including conventional RAID parity or simple data duplication for each band. The erasure coding can be devised in a manner that provides efficient utilization, encoding, decoding or subject to other constraints of the storage system.

Figure 15:
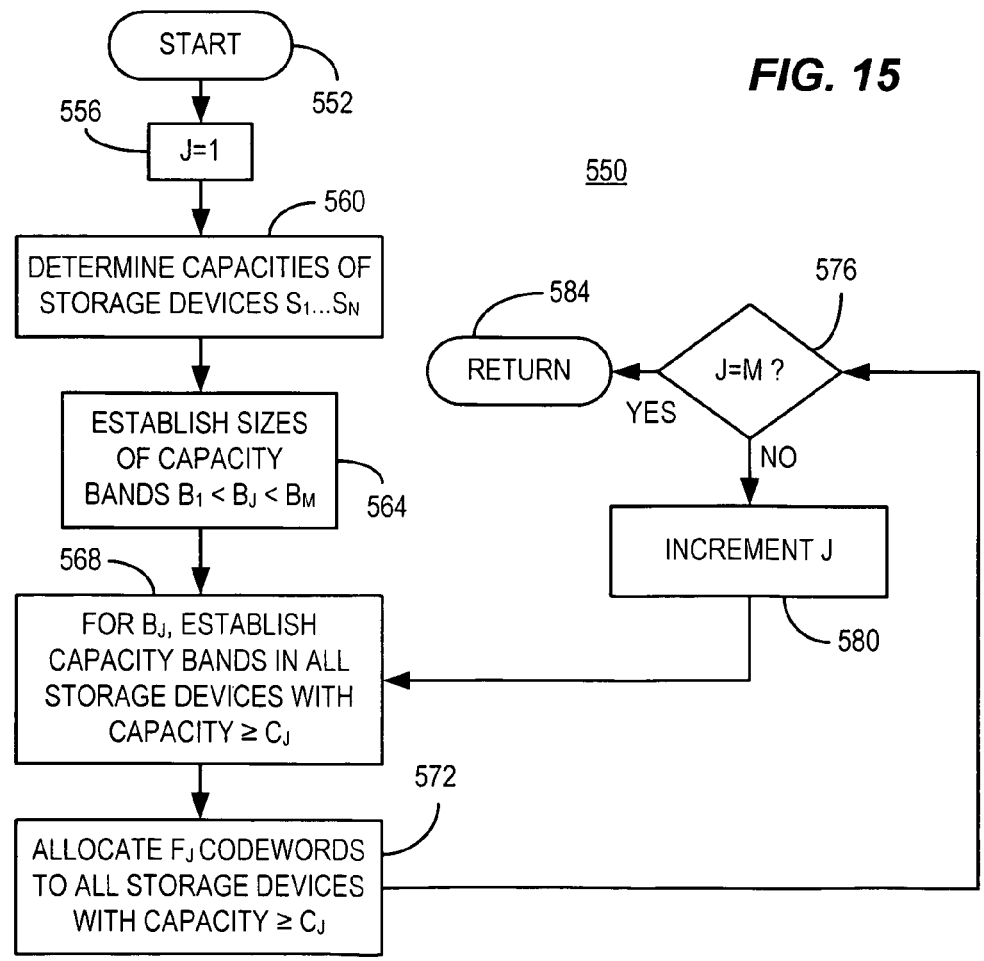
FIG. 15 is a flow chart describing another allocation process 550 consistent with certain embodiments of the present invention.

The present banded embodiment is further illustrated as process 550 in the flow chart of FIG. 15 starting at 552. At 556, a counting integer J is initialized at $J = J_1$. At 560, the capacities of each of the N storage devices $S_1 \ldots S_N$ is determined. At 564, the capacities of the capacity bands $B_1 < B_J < B_M$ is then determined for the M different sizes of storage devices, potentially excluding a largest capacity if a single storage device remains with the largest capacity (e.g., device $S_N$ of FIG. 14). At 568, for the $J^{th}$ band $B_J$, a capacity band is established in each storage device with enough capacity (capacity $\geq C_J$). Once capacity bands are established, codewords such as fountain codewords $F_J$ are allocated at 572 for all storage devices with enough storage capacity (capacity$\geq C_J$). If J is not equal to M (the last band) at 576, J is incremented at 580 and the process returns to 568. Once J is equal to M at 576, the process returns at 584 with storage in all bands $B_1 \ldots B_M$ allocated.

Thus, a method consistent with certain embodiments for storing data across a plurality of N storage devices $S_1 \ldots S_N$, wherein at least certain of the storage devices have a storage capacity $C_{MIN}=C_J \leq C_K \leq C_{MAX}$ involves establishing a first capacity band equal in capacity to $C_{MIN}$ in each of the storage devices; encoding a collection of source data with an erasure encoder to produce $F_J$ erasure codewords; allocating the $F_J$ erasure codewords among the N storage devices $S_1 \ldots S_N$; establishing a second capacity band equal in capacity to $C_K$ in each of the storage devices having capacity$\geq C_K$; encoding a collection of source data with an erasure encoder to produce $F_K$ erasure codewords; allocating the $F_K$ erasure codewords among the storage devices among $S_1 \ldots S_N$ having capacity$\geq C_K$.

In this embodiment, reallocation after loss or addition of storage devices can be handled the same as in a new configuration. Essentially a new system is designed based on the new configuration, and data is gradually moved from the old structure to the new. If using traditional RAID (XOR) parity, it may be trickier to maintain the old structure while copying to the new, but nevertheless, reconstruction of the system can be carried out in the same way. In other embodiments, other reconstruction methods may be implemented.

Those skilled in the art will recognize, upon consideration of the above teachings, that certain of the above exemplary embodiments are based upon use of a programmed processor. However, the invention is not limited to such exemplary embodiments, since other embodiments could be implemented using hardware component equivalents such as special purpose hardware and/or dedicated processors. Similarly, general purpose computers, microprocessor based computers, micro-controllers, optical computers, analog computers, dedicated processors, application specific circuits and/or dedicated hard wired logic may be used to construct alternative equivalent embodiments.

Certain embodiments described herein, are or may be implemented using a programmed processor acting in the capacity of a fountain encoder and decoder executing programming instructions that are broadly described above in flow chart form that can be stored on any suitable electronic or computer readable storage medium and/or can be transmitted over any suitable electronic communication medium. However, those skilled in the art will appreciate, upon consideration of the present teaching, that the processes described above can be implemented in any number of variations and in many suitable programming languages without departing from embodiments of the present invention. For example, the order of certain operations carried out can often be varied, additional operations can be added or operations can be deleted without departing from certain embodiments of the invention. Error trapping can be added and/or enhanced and variations can be made in user interface and information presentation without departing from certain embodiments of the present invention. Such variations are contemplated and considered equivalent. The programming instructions that in certain instances are broadly described above in flow chart form can be stored on any suitable electronic or computer readable storage medium (such as, for example, disc storage, Read Only Memory (ROM) devices, Random Access Memory (RAM) devices, network memory devices, optical storage elements, magnetic storage elements, magneto-optical storage elements, flash memory, core memory and/or other equivalent volatile and non-volatile storage technologies) and/or can be transmitted over any suitable electronic communication medium.

While certain illustrative embodiments have been described, it is evident that many alternatives, modifications, permutations and variations will become apparent to those skilled in the art in light of the foregoing description. The use of reference letters in the claims that follow should not be construed to assign an absolute order to the steps or acts associated therewith.

What is claimed is:

1. A method of allocating storage for storing data across a plurality of N storage devices $S_1 \ldots S_N$, wherein at least one of the storage devices has a storage capacity that is not equal to a storage capacity of others of the storage devices, the method comprising:
   a) determining a maximum capacity $C_{MAX}$ of a storage device $S_{MAX}$ having a largest capacity of the plurality of storage devices $S_1 \ldots S_N$;
   b) determining a total storage capacity C of all of the plurality of storage devices $$S_1 \ldots S_N \text{ as } C = \sum_{K=1}^{N} C_K,$$

where K is a counting integer;
   c) defining a maximum total number of fountain codewords $$F = \sum_{K=1}^{N} F_K$$

that could be stored in the plurality of storage devices $S_1 \ldots S_N$;
   d) defining $F_{MAX}$ as a maximum number of fountain codewords that would be lost if the data in $S_{MAX}$ is lost;
   e) estimating a target ratio of capacity to fountain codewords V as $V \approx C/F \approx (C-C_{MAX})/(F-F_{MAX}) \approx (C-C_{MAX})/R$, where R is a number of fountain codewords required to recover $C_{MAX}$ if the data in $S_{MAX}$ is lost;
   f) using the estimate of the value of V to estimate the values of $F_1 \ldots F_N$ as $F_K = \text{Int}(C_K/V)$;
   g) adjusting the estimated values of $F_1 \ldots F_N$ by addition of a rounding factor $F_K = \text{Int}(C_K/V+L)$ to assure that $$\left(\sum_{K=1}^{N} F_K\right) - F_{MAX} \geq R;$$

and
   h) allocating fountain codewords, and storing data to the storage devices $S_1 \ldots S_N$ in proportion to the estimated values of $F_1 \ldots F_N$.

2. The method according to claim 1, wherein the storage devices $S_1 \ldots S_N$ comprise at least one of a disc storage device, a Random Access Memory (RAM) device, a network memory device, an optical storage device, a magnetic storage element, a magneto-optical storage element, or a flash memory.

3. The method according to claim 1, further comprising:
   determining that a storage device $S_{N+1}$ is available for storage of the codewords;
   reallocating the codewords across the plurality of storage devices $S_1 \ldots S_{N+1}$.

4. The method according to claim 3, wherein the reallocating comprises moving codewords from certain of the storage devices $S_1 \ldots S_N$ to storage device $S_{N+1}$.

5. The method according to claim 3, wherein the reallocation is carried out subject to the constraint that $$\left(\sum_{K=1}^{N+1} F_K\right) - F_{\text{MAX}} \geq R,$$

where $F_{MAX}$ is the number of codewords to be stored on the largest of storage devices $S_1 \ldots S_{N+1}$.

6. The method according to claim 3, wherein the reallocation comprises:
   i) determining a new maximum capacity $C_{MAX}$ of a storage device $S_{MAX}$ having a largest capacity of the plurality of storage devices $S_1 \ldots S_{N+1}$;
   j) determining a total storage capacity C of all of the plurality of storage devices $$S_1 \ldots S_{N+1} \text{ as } C = \sum_{K=1}^{N+1} C_K;$$

k) defining a maximum total number of fountain codewords $$F = \sum_{K=1}^{N+1} F_K$$

that could be stored in the plurality of storage devices $S_1 \ldots S_{N+1}$;
   l) defining $F_{MAX}$ as a maximum number of fountain codewords that would be lost if the data in $S_{MAX}$ is lost;
   m) estimating a revised target ratio of capacity to fountain codewords V as $V \approx C/F \approx (C-C_{MAX})/(F-F_{MAX}) = (C-C_{MAX})/R$, where R is a number of fountain codewords required to recover $C_{MAX}$ if the data in $S_{MAX}$ is lost;
   n) using the estimate of the value of V to estimate the values of $F_1 \ldots F_{N+1}$ as $F_K = \text{Int}(C_K/V)$;
   o) adjusting the estimated values of $F_1 \ldots F_{N+1}$ by addition of a rounding factor to assure that $$\left(\sum_{K=1}^{N+1} F_K\right) - F_{\text{MAX}} \geq R;$$

and
   p) allocating fountain codewords storing data to the storage devices $S_1 \ldots S_{N+1}$ in proportion to the adjusted values of $F_1 \ldots F_{N+1}$.

7. The method according to claim 1, further comprising:
   determining that storage device $S_P$, being any one of storage devices $S_1 \ldots S_N$ is no longer available for storage of the codewords;
   reallocating the codewords across the plurality of storage devices $S_1 \ldots S_N$ excluding $S_P$.

8. The method according to claim 7, wherein the reallocating comprises calculating a new allocation:
   generating new codewords; and
   distributing the new codewords among the storage devices $S_1 \ldots S_N$ excluding $S_P$.

9. The method according to claim 7, wherein the reallocation is carried out subject to the constraint that $$\left(\sum_{K=1}^{N} F_K\right) - F_P - F_{\text{MAX}} \geq R,$$

where $F_P$ is the number of codewords that were allocated to storage device $S_P$ and $F_{MAX}$ is the number of codewords to be stored on the largest of storage devices $S_1 \ldots S_N$ other than $S_P$.

10. The method according to claim 7, wherein the reallocation comprises:
   i) determining a new maximum capacity $C_{MAX}$ of a storage device $S_{MAX}$ having a largest capacity of the plurality of storage devices $S_1 \ldots S_N$ excluding $S_P$;
   j) determining a total storage capacity C of all of the plurality of storage devices $S_1 \ldots S_N$ excluding $S_P$ as $$C = \left(\sum_{K=1}^{N} C_K\right) - C_P;$$

k) defining a maximum total number of fountain codewords $$F = \left(\sum_{K=1}^{N} F_K\right) - F_P$$

that could be stored in the plurality of storage devices $S_1 \ldots S_N$ excluding $S_P$;
   l) defining $F_{MAX}$ as a maximum number of fountain codewords that would be lost if the data in $S_{MAX}$ is lost;
   m) estimating a revised target ratio of capacity to fountain codewords V as $V \approx C/F \approx (C-C_{MAX})/(F-F_{MAX}) \approx (C-C_{MAX})/R$, where R is a number of fountain codewords required to recover $C_{MAX}$ if the data in $S_{MAX}$ is lost;
   n) using the estimate of the value of V to estimate the values of $F_1 \ldots F_{N+1}$ as $F_K = \text{Int}(C_K/V)$ for $S_1 \ldots S_N$ excluding $S_P$;
   o) adjusting the estimated values of $F_1 \ldots F_{N+1}$ by addition of a rounding factor to assure that $$\left(\sum_{K=1}^{N+1} F_K\right) - F_{\text{MAX}} \geq R$$

for each of $S_1 \ldots S_N$ excluding $S_P$; and
   p) allocating fountain codewords storing data to the storage devices $S_1 \ldots S_N$ excluding $S_P$ in proportion to the estimated values of $F_1 \ldots F_N$.

11. The method according to claim 1, further comprising:
   determining that storage device $S_P$, being any one of storage devices $S_1 \ldots S_N$ is no longer available for storage of the codewords;
   determining if it is possible to reallocate codewords representing all stored data on the remaining storage devices $S_1 \ldots S_N$ excluding $S_P$; and
   if not, establishing that an error condition exists.

12. A computer readable storage medium storing instructions which, when executed on a programmed processor, carry out the method according to claim 1.

* * * * *

UNITED STATES PATENT AND TRADEMARK OFFICE
CERTIFICATE OF CORRECTION

PATENT NO. : 7,596,673 B2  Page 1 of 1
APPLICATION NO. : 11/297271
DATED : September 29, 2009
INVENTOR(S) : Read It is certified that error appears in the above-identified patent and that said Letters Patent is hereby corrected as shown below:

In column 17, line 5, delete "Mat" and insert -- M at -- therefor.

In the following instances, replace "≧" with -- $\geq$ --:
    In column 8, line 23, after $F_{MAX}$.
    In column 8, line 27, after $F_{MAX}$.
    In column 8, line 44, after $F_{MAX}$.
    In column 13, line 67, after be.
    In column 15, line 22, after $F_{MAX}$.
    In column 15, line 43, after $F_{MAX}$.
    In column 15, line 47, before R.
    In column 16, line 37, after R.
    In column 16, line 67, before $C_J$.
    In column 17, line 3, before $C_J$.
    In column 17, line 16, before $C_K$.
    In column 17, line 20, before $C_K$.

In the following instances, replace "≦" with -- $\leq$ --:
    In column 16, line 26, before $C_2$.
    In column 16, line 26, before $C_N$.
    In column 17, line 10, before $C_K$.
    In column 17, line 10, before $C_{MAX}$.

Signed and Sealed this

Twenty-ninth Day of December, 2009

David J. Kappos
*Director of the United States Patent and Trademark Office*

UNITED STATES PATENT AND TRADEMARK OFFICE
CERTIFICATE OF CORRECTION

PATENT NO. : 7,596,673 B2  Page 1 of 1
APPLICATION NO. : 11/297271
DATED : September 29, 2009
INVENTOR(S) : Christopher Jensen Read It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 832 days.

Signed and Sealed this

Twenty-eighth Day of September, 2010

David J. Kappos
*Director of the United States Patent and Trademark Office*